United States Patent
Iguchi et al.

(10) Patent No.: US 8,120,061 B2
(45) Date of Patent: Feb. 21, 2012

(54) LIGHT RECEIVING DEVICE

(75) Inventors: Yasuhiro Iguchi, Osaka (JP); Yuichi Kawamura, Sakai (JP)

(73) Assignees: Sumitomo Electric Industries, Ltd., Osaka-shi (JP); Osaka Prefecture University Public Corporation, Sakai-shi (JP)

( * ) Notice: Subject to any disclaimer, the term of this patent is extended or adjusted under 35 U.S.C. 154(b) by 415 days.

(21) Appl. No.: 12/522,296

(22) PCT Filed: Jan. 7, 2008

(86) PCT No.: PCT/JP2008/050026
§ 371 (c)(1),
(2), (4) Date: Jul. 7, 2009

(87) PCT Pub. No.: WO2008/084772
PCT Pub. Date: Jul. 17, 2008

(65) Prior Publication Data
US 2009/0321785 A1 Dec. 31, 2009

(30) Foreign Application Priority Data
Jan. 10, 2007 (JP) .................................. 2007-002104

(51) Int. Cl.
*H01L 31/102* (2006.01)

(52) U.S. Cl. ................................. 257/184; 257/E31.019

(58) Field of Classification Search .................. 257/184, 257/E31.019
See application file for complete search history.

(56) References Cited

FOREIGN PATENT DOCUMENTS

| JP | 61-212072 | 9/1986 |
|----|-----------|--------|
| JP | 63-186416 | 8/1988 |
| JP | 9-219563 | 8/1997 |
| JP | 2003-282927 | 10/2003 |
| JP | 2006-270060 | 10/2006 |

OTHER PUBLICATIONS

Murakami et al., "$In_xGa_{1-x}As/InAs_yP_{1-y}$ detector for near infrared (1-2.6 μ m)", Conference Proceedings of Indium Phosphide and Related Materials, pp. 528-531.
Matthews et al., "Defects in epitaxial multipayers", Journal of Crystal Growth, vol. 27, pp. 118-125 (1974). Jesser et al., "Evidence for pseudomorphic growth of iron on copper", Phil. Mag., vol. 15, pp. 1097-1106 (1967).
Matthews et al., "Defects in epitaxial multilayers", Journal of Crystal Growth, vol. 27, pp. 118-125 (1974).

*Primary Examiner* — Ha Tran T Nguyen
*Assistant Examiner* — Shaun Campbell
(74) *Attorney, Agent, or Firm* — Venable LLP; Michael A. Sartori, Ph.D.

(57) ABSTRACT

A light receiving device having small dark current and capable of sensing light in the wavelength range of 2.0 μm to 3.0 μm with high sensitivity is provided. The light receiving device has an InP substrate, and a light receiving layer formed by alternately stacking a larger layer formed of GaInNAsSbP mixed crystal having nitrogen content of at most 5% in 5 group, larger lattice constant than that of InP and thickness between hc and 11hc, the critical thickness hc being determined as $hc = b(1-\nu \cos^2\alpha)\{\log(hc/b)+1\}/8\pi f(1+\nu)\cos\lambda$ and a smaller layer formed of GaInNAsSbP mixed crystal having nitrogen content of at most 5% in 5 group, smaller lattice constant than that of InP and thickness between hc and 11hc; absolute value of lattice mismatch of the larger layer and the smaller layer to the InP substrate is at least 0.5% and at most 5%; at least one of the layers has absorption edge wavelength of 2.0 μm to 3.0 μm; total thickness of respective layers is 2.0 μm to 4.0 μm; and thickness-weighted average lattice mismatch is set to be at most ±0.2%.

8 Claims, 8 Drawing Sheets

LIGHT RECEIVING DEVICE

TECHNICAL FIELD

The present invention relates to a light receiving device using 3-5 group compound semiconductor having sensitivity in near infrared range, particularly in the wavelength range of 0.92 μm to 3.0 μm.

BACKGROUND ART

Currently, a photodiode for optical communication having an InGaAs light receiving layer formed on an InP substrate is used. For optical communication, near infrared of 1.3 μm band and 1.55 μm band are often used for transmission/reception. Therefore, mixed crystal ratio (Ga=0.47, In=0.53) of InGaAs is determined from matching condition with an InP substrate, and photosensitivity is limited to light of up to 1.6 μm. Though a photodiode can sense and receive light having the energy equal to or higher than the band gap Eg, it is not sensitive to light of which energy is not higher than the band gap Eg.

Infrared light having long wavelength of 1.6 μm to 3 μm can be received only by a semiconductor material having a very small band gap Eg. It is difficult to find a material having such a narrow band gap. Even if a material satisfies the condition of narrow band gap, the material might not grow or not well match the substrate. Even if successfully grown, a light emitting device may not emit light, and even if successfully grown, a light receiving device may not be practically used, as it may have too large dark current or unsatisfactory sensitivity.

Japanese Patent Laying-Open No. 09-219563 (Patent Document 1) proposes a light emitting element and a light receiving element that have quaternary mixed crystal of GaInNAs as a photoactive layer and a light absorbing layer. This proposes a light emitting device and a light receiving device that emit and receive mid infrared light of 1.7 μm to 5 μm. By appropriately selecting the mixed crystal ratio, GaInNAs band gap of 0.73 eV or smaller can be attained. Further, it is asserted that GaInNAs allows formation of high-quality crystal with very few crystal defects that can attain lattice matching with an InP substrate.

Japanese Patent Laying-Open No. 2003-282927 (Patent Document 2) aims to fabricate a photodiode for optical communication having small dark current and sensitivity (of about 1.63 μm) closer to L-band edge (1700 nm). A plurality of layers of $In_{0.53}Ga_{0.47}As$ having a lattice constant smaller than InP and $In_{0.55}Ga_{0.45}As$ having a lattice constant larger than InP are stacked and lattice matching with InP is attained. By alternately stacking thin films having lattice constant smaller than the lattice constant of the substrate and thin films having lattice constant larger than that of the substrate, quasi lattice matching is established. The resulting device, however, cannot sense and receive light of 1.7 μm or longer. An object of the present invention is to provide a light receiving device having a narrow band gap that can sense and receive light having the long wavelength of 1.7 μm to 3 μm.

T. Murakami et al., "$In_xGa_{1-x}As/InAs_yP_{1-y}$ detector for near infrared (1-2.6 μm)", Conference Proceedings of Indium Phosphide and Related Materials (Non-Patent Document 1) proposes a mid-infrared photodiode having an InGaAs light receiving layer. To satisfy the condition of attaining lattice matching with InP, in conventional photodiodes, the ratio was always $In_{0.53}Ga_{0.47}As$. The conventional example having 53% In has wide band gap and, therefore, mid infrared light having the wavelength of 1.6 μm or longer cannot be received.

In Non-Patent Document 1, among InGaAs mixed crystals, $In_{0.82}Ga_{0.18}As$ is used, in which the ratio of Ga is decreased and the ratio of In is increased to make the band gap narrower, as the light receiving layer.

It is asserted that as the ratio of InP increases, the band gap becomes narrower and as the band gap becomes narrower, sensitivity to infrared light having the wavelength up to 2.6 μm can be attained. The device, however, has a problem that significant lattice mismatch between the InGaAs light receiving layer and the InP substrate causes large number of lattice defects and eventually leads to high dark current. Therefore, in the device of Non-Patent Document 1, graded layers of $InAs_yP_{1-y}$ having the value y varied little by litter among 12 to 20 layers are interposed between the InP substrate and the InGaAs light receiving layer. This is said to be effective to decrease dark current. The dark current, however, is about 20 μA to about 30 μA, which is still too high.

J. W. Matthews and A. E. Blakeslee, "Defects in Epitaxial Multilayers", J. Cryst. Growth Vol. 27 (1974), pp. 118-125 (Non-Patent Document 2) discloses calculation of a critical thickness at which occurrence of misfit dislocation can be prevented when a GaAsP mixed crystal thin film is epitaxially grown on a GaAs substrate. Though the types of substrate and thin film are much different from those of the present invention, it is important as the critical thickness is clearly given. This will be discussed later.

Patent Document 1: Japanese Patent Laying-Open No. 09-219563 "Semiconductor Light Element, and Application System Using It"

Patent Document 2: Japanese Patent Laying-Open No. 2003-282927 "Photodiode"

Non-Patent Document 1: T. Murakami et al., "$In_xGa_{1-x}As/InAs_yP_{1-y}$ detector for near infrared (1-2.6 μm)", Conference Proceedings of Indium Phosphide and Related Materials Non-Patent Document 2: J. W. Matthews and A. E. Blakeslee, "Defects in Epitaxial Multilayers", J. Cryst. Growth Vol. 27 (1974), pp. 118-125

Non-Patent Document 3: W. A. Jesser and J. W. Matthews, "Evidence for Pseudomorphic Growth of Iron on Copper", Phil. Mag. Vol. 15 (1967) pp. 1097

DISCLOSURE OF THE INVENTION

Problems to be Solved by the Invention

Patent Document 1 discloses a light emitting device using GaInNAs as an active layer and a light receiving device using GaInNAs as a light receiving layer. Specific mixed crystal ratio, however, is not clarified in the embodiments. Therefore, we cannot see what mixed crystal ratio leads to what band gap, and specific band gap value is not mentioned, either. Lattice mismatch with the InP substrate is not described, either. Since the mixed ratio is not known, it is impossible for a reader to calculate effective lattice constant of the thin film. In GaInNAs, large mixed crystal ratio of nitrogen is believed to make crystal growth difficult. Such discussion, however, is not found in Patent Document 1.

Though various proposals have been made on light emitting devices and light receiving devices using quaternary mixed crystal of GaInNAs, practical devices have not been realized. Though there are various proposals, a light receiving device that can actually sense and receive infrared light having the wavelength of 2.0 μm to 3.0 μm has not yet been fabricated.

There are many reasons. One is that crystal growth of quaternary mixed crystal GaInNAs itself is difficult. Particularly, in order to realize sensitivity to light having the wavelength of up to 3 μm and to attain lattice matching with an InP substrate, it is necessary to increase nitrogen (N) composition to 10%. It is difficult, however, to manufacture GaInNAs having nitrogen composition increased to 10% and still having good crystal characteristic. Further, in order to provide a light receiving device having high sensitivity, the light receiving layer (light absorption layer) must have the thickness of at least 2 μm and preferably about 4 μm. Growth of such a thick GaInNAs layer is more difficult. From there reasons, though various hypothetic proposals of photodiodes having GaInNAs light receiving layer have been made, actual device is not available at present.

Patent Document 2 aims to receive infrared light having long wavelength by increasing the ratio of In (In =0.55) in the tertiary mixed crystal InGaAs light receiving layer (in which normally In =0.53). The ratio of In, however, cannot be much increased (In =0.55) as mismatch with the InP substrate increases, and therefore, the upper limit of sensible wavelength is at most about 1.63 μm. It is impossible to receive light of long wavelength of 1.7 μm to 3 μm as intended in the present invention. Patent Document 2 is silent about average lattice mismatch of the light receiving layer as a whole, and it is silent about the influence of lattice mismatch on the device. The inventor has found that average degree of lattice mismatch is an important parameter that significantly increases dark current.

Non-Patent Document 1 combines a number of InAsP graded layers to relax lattice mismatch between the InP substrate and the $In_{0.82}Ga_{0.18}As$ light receiving layer. It is difficult, however, to epitaxially grow a number of layers having the value y varied little by little. This approach is not preferable, as it leads to higher cost and results in high dark current.

Non-Patent Document 1 discloses dark current larger by about 1000 times than the dark current in a photodiode for optical communication having InGaAs light receiving layer (In ratio 0.53) epitaxially grown on a common InP substrate. Further, as InAsP is used as a window layer rather than InP, sensitivity at a short wavelength range of 1.5 μm or shorter decreases because of window effect corresponding to the composition thereof. Further, there is a very high stress in the crystal and, as a result it tends to crack during the process and production yield is low.

Means for Solving the Problems

The present invention proposes a photodiode having a light receiving layer of which average lattice mismatch ratio to an InP substrate is at most ±0.2% (−0.2% to 0.2%, or the absolute value of the average lattice mismatch ratio is at most 0.2%), by combining positive-mismatched material and negative-mismatched material, each of which is any of GaInNAs, GaInNAsSb, GaInNAsP and GaInNAsSbP having absorption edge wavelength of 2.0 μm to 3.0 μm (absorption edge wavelength in the wavelength range of 2.0 μm to 3.0 μm), having nitrogen content of at most 5% in 5 group and thickness t being 1 to 11 times the critical thickness hc.

Two materials are combined as light receiving layers to be stacked, and what is necessary is that one of these is sensitive to 2.0 μm to 3.0 μm. The other may not have sensitivity to the wavelength of this range. Both may have sensitivity to the light of this wavelength range. Whether it is sensitive or not can be defined only after the photodiode is completed. A semiconductor is capable of absorbing light having the energy larger than the band gap. Wavelength corresponding to the band gap is referred to as the absorption edge wavelength. Therefore, it is necessary that at least one of the light receiving layers has the absorption edge wavelength in the range of 2.0 μm to 3.0 μm. Both may have the absorption edge wavelength in this range.

In the present invention, the composition of light receiving layer may generally be represented as $Ga_uIn_{1-u}N_xAs_{1-x-y-z}Sb_yP_z$. Here, u represents mixed crystal ratio of Ga, and (1−u) represents mixed crystal ratio of In. Only Ga and In are 3-group elements and, therefore, there is only one independent mixed crystal ratio. As to 5-group, there are four elements, that is, As, Sb, P and N, and hence, there are three independent mixed crystal ratios. Here, x represents mixed crystal ratio of N, y represents mixed crystal ratio of Sb, z represents mixed crystal ratio of P and (1-x-y-z) represents mixed crystal ratio of As.

Good crystals could not be formed in proposals made in, for example, Patent Document 1, as the ratio x was x>0.1. In the present invention, the mixed crystal ratio of nitrogen of the light receiving layer is set to x≦0.05. With x being x≦0.05, it becomes possible to form a good crystal on the InP substrate. Further, in the present invention, two light receiving layers having different compositions are combined. One is a larger layer L, having lattice constant larger than that of InP. The other is a smaller layer S, having lattice constant smaller than that of InP. Lattice mismatch between each of the layers and InP may be about ±0.5% to about ±5%. From another viewpoint, lattice mismatch between each of the layers and InP may be at least 0.5% to at most 5% in absolute value. It is noted, however, that the average lattice mismatch with InP must be at most ±0.2% (from −0.2% to 0.2%).

The average lattice mismatch represents an average with thickness of mismatch in each layer multiplied as a weight. Lattice mismatch is defined as $$\Delta a = (a-a_0)/a_0 \quad (1)$$

In the material of a larger layer, Δa is positive, while in the material of a smaller layer, Δa is negative. Each layer will be represented by an appended number j. Thickness will be represented by t. Mismatch of a layer j is denoted by $\Delta a_j$, and thickness of the layer j is denoted by $t_j$.

Average lattice mismatch can be defined as $<\Delta a> = \Sigma \Delta a_j t_j / \Sigma t_j$. Actually, only two different materials are stacked. Respective number of stacked layers will be represented by n. Lattice mismatch, thickness and the number of larger layers will be represented as $\Delta a_l$, $t_l$ and $n_l$, while lattice mismatch, thickness and the number of smaller layers will be represented as $\Delta a_s$, $t_s$ and $n_s$, and the average lattice mismatch is given as $$<\Delta a> = (\Delta a_l t_l n_l + \Delta a_s t_s n_s)/(t_l n_l + t_s n_s) \quad (2)$$

The numbers of each layers may be the same ($n_l=n_s$) or different by 1 ($n_l=n_s\pm 1$). If the numbers are the same ($n_l=n_s$), the relation will be further simplified to $$<\Delta a> = (\Delta a_l t_l + \Delta a_s t_s)/(t_l + t_s) \quad (3)$$

At least one of the light receiving layers has sensitivity in the range of 2.0 μm to 3.0 μm, and it is formed by combining a larger layer and a smaller layer, with average lattice mismatch of at most ±0.2%. Further, thicknesses of respective light receiving layers $t_s$ and $t_l$ are 1 to 11 times the critical thicknesses $hc_s$ and $hc_l$, respectively.

$$hc_s < t_s < 11 hc_s \quad (4)$$

$$hc_l < t_l < 11 hc_l \quad (5)$$

The critical thickness hc represents limit thickness above which misfit dislocation generates, and it is given in Non-Patent Document 2 discussing GaAs/GaAsP substrate/thin film system. In the present invention, a slightly simplified form of this will be used for evaluating the thickness of light receiving layer.

The equation of critical thickness hc given by J. W. Matthews and A. E. Blakeslee is as follows. It represents a limit thickness below which generation of misfit dislocation can be avoided.

$$hc=b(1-\nu \cos^2\alpha)\{\log(hc/b)+1\}/8\pi f(1+\nu)\cos \lambda \qquad (6)$$

Here, $\nu$ represents Poisson ratio, and $\alpha$ represents an angle formed by a segment of dislocation line and Burgers vector at the interface. Further, log represents natural logarithm, and $\lambda$ represents an angle formed by Burgers vector and the direction in the interface vertical to the intersection of the interface and the glide plane. Here, $b=a/2^{1/2}$, and f represents lattice mismatch $f=\Delta a=(a-a_0)/a_0$. Burgers vector differs dislocation by dislocation. Values $\alpha$ and $\lambda$ depend on Burgers vector. Specifically, the equation has a different solution for a different dislocation. There are a plurality of solutions, that is, one solution for this dislocation ($\alpha$, $\lambda$) and another solution for that dislocation.

Such a situation, however, is inconvenient for film thickness evaluation. Therefore, dislocation type is fixed with $\alpha$ and $\lambda$ being 60°. Then, $\cos \alpha=0.5$ and $\cos \lambda=0.5$, and only one solution results. The present invention takes this approach to provide a unique solution.

In the equation, hc is in the logarithm on the right side, and hence, the right side is not constant. Therefore, hc cannot be solved analytically. Referring to FIG. 7, the right side is plotted in a graph as a function of hc, a diagonal line of 45° representing hc=hc is drawn as the left side, and the critical thickness hc can be found from the value at the intersection.

Poisson ratio is roughly fixed in the range of about 0.25 to about 0.3. As mentioned above, we assume $\cos \alpha=0.5$ and $\cos \lambda=0.5$. Therefore, we can see that b and f are important elements to determine the value of right side. Lattice constant of InP is approximately 0.59 nm and, therefore, the mixed crystal to be matched therewith is considered to have comparable lattice constant. The value b obtained by dividing the lattice constant as such by 1.414 is about 0.41 to about 0.42 mm. This can also be roughly determined. Then, $b/8\pi$ is about 0.016 nm.

Here, $(1-\nu \cos^2\alpha)$ is about 0.93 and $1+\nu$ is about 1.3. Therefore, the portion of $b(1-\nu \cos^2\alpha)/8\pi(1+\nu)$ would be about 0.010 to about 0.012. Accordingly, the factor that dominantly determines hc is f. If we calculate coefficients close to 1 by approximation, we can see that the right side that determines hc depends on f. The value $\{\log(hc/b)+1\}$ is approximately 4. Thus, f is the factor that most sharply defines hc, and if it is assumed to be 0.01, hc would be about 7 nm to about 10 nm.

In the present invention, the thickness t of each layer is 1 to 11 times hc. According to J. W. Matthews and A. E. Blakeslee, misfit dislocation does not generate if t<hc, Therefore, it might be desirable to have a thin epitaxial layer of t<hc.

It has been experimentally proved that while dislocation generates if thickness of a single layer exceeds the critical thickness (hc), dislocation does not occur even if the thickness is larger than the critical thickness when positive and negative layers are stacked alternately. If the thickness exceeds 11 times the critical thickness (>11hc), however, dislocation occurs. If the thickness is equal to or smaller than the critical thickness (hc), dislocation increases as the interface increases.

In order to make the value t smaller and to decrease the number of borders, it is effective to reduce the overall film thickness. If the thickness of light receiving layer decreases, however, absorption decreases and, hence, sensitivity decreases. Desired film thickness of the light receiving layer is, for each of the larger layer and the smaller layer at least 2.0 µm. Too large a thickness is meaningless and, therefore, it is preferred that the total film thickness of respective layers is about 2.0 µm to about 4.0 µm.

As the total film thickness (nt) is determined as such, it means that if each film thickness t is small, the number of layers n increases. This leads to larger number of interfaces as the cause of dislocations. According to the equation of Matthews/Blakeslee, the critical thickness is about 7 nm to about 10 nm. If the thickness not larger than the critical thickness according to Matthews/Blakeslee is to be realized, film thickness of 5 nm, for example, must be realized. In order to attain the total thickness of 2.0 µm using layers of which unit thickness is 5 nm, mixed crystal films of 400 layers or more are necessary. As the present invention combines two different types of mixed crystals, the necessary number of layers would be 800 or more. It is difficult to form mixed crystal layers having delicate compositions in as large a number as 800, while maintaining matching between each other.

In the present invention, based on experiments, thickness exceeding the critical thickness is tolerated. The thickness is set to be hc to 11hc, rather than hc or smaller. If the critical thickness is 10 nm, 10 times that will be 100 nm. When 20 layers having such thickness are stacked, a light receiving layer of 200 nm can be formed. This is an attempt beyond the conventional teaching of Matthews/Blakeslee.

Further, in the present invention, an InP window layer is provided on the light receiving layer, so that surface recombination can be prevented and dark current can be reduced. Further, an InGaAs layer of which lattice mismatch with InP substrate is within ±0.2% (−0.2% to 0.2%) is provided on the light receiving layer, so that a pn junction is formed in the InGaAs layer, realizing a light receiving device having low dark current.

Effects of the Invention

In the present invention, two light receiving layers, that is, a larger layer and a smaller layer, having lattice constant larger than and smaller than that of InP and formed of GaInNAsSbP having nitrogen composition of at most 5% (x<0.05) and sensitivity in the range of 2.0 µm to 3.0 µm, are stacked. As the nitrogen composition is as small as 5% or less, good crystal characteristic can be realized. It is believed necessary to increase nitrogen content to realize sensitivity to longer wavelength. When nitrogen content is increased, however, crystal characteristic of mixed crystal degrades. Therefore, in the present invention, nitrogen content is set to at most 5%. Expanded sensitivity to near infrared is supposed to be increased by adding Sb or P, rather than increasing nitrogen.

Though lattice mismatch is observed between the InP substrate and the quaternary, pentanary and hexanary GaInNAsSbP light receiving layers, the layers successfully match with InP and grows, as the average lattice mismatch is set to be at most ±0.2%. Further, as each film is set to have t of at least the critical film thickness hc and at most 11 times the critical thickness hc (hc<t<11hc), good crystal can be formed. Thus, a light receiving device having small dark current and sensitivity to infrared of up to 3 µm can be obtained.

DESCRIPTION OF THE REFERENCE SIGNS

2 InP substrate, 3 InP buffer layer, 4~9 light receiving layers, 20 InP window layer, 22 p region, 23 InGaAs layer.

BEST MODES FOR CARRYING OUT THE INVENTION

Originally, Matthews/Blakeslee studied misfit dislocations generated when iron is epitaxially grown on a copper single crystal. W. A. Jesser and J. W. Matthews, "Evidence for Pseudomorphic Growth of Iron on Copper", Phil. Mag. Vol. 15 (1967) pp. 1097 (Non-Patent Document 3) clarifies a mechanism how a dislocation generates during epitaxial growth of Fe/Cu, in a hypothetical model. Non-Patent Document 2 describes a GaAsP epitaxial layer grown on a GaAs substrate, in which the idea of critical thickness is clarified. The equation of critical thickness of Matthews/Blakeslee does not involve modulus of rigidity G and, therefore it is easy to use. Hence, it is often used for evaluating a semiconductor epitaxial layer.

Non-Patent Document 2 is an old reference of 1974. It was published immediately after the invention of room-temperature continuous oscillation semiconductor laser of 1971. Non-Patent Document 2 is directed to a light emitting device, of which active layer is very thin. The active layer is in most cases at most 100 nm. In a light emitting device, a large current is caused to flow and, therefore, dislocations tend to multiply, and multiplied dislocations lead to degradation. Therefore, the article mainly focuses on prevention of misfit dislocations.

After Matthews/Blakeslee, it has been a common understanding that both in a light emitting device and in a light receiving device, each film thickness must not exceed the critical film thickness of Matthews/Blakeslee.

Conditions are different, however, in a light emitting device and a light receiving device. The present invention is directed to a light receiving device. In a light receiving device, the light receiving layer must have a certain thickness to ensure sensitivity. In the present invention, total thickness of two different materials is set to 2.0 μm to 4.0 μm. It is often the case that the critical thickness according to Matthew/Blakeslee is at most 10 nm. Therefore, in order to attain the total film thickness as such, 200 or more layers must be stacked. Further, the layers must be of two different mixed crystals stacked alternately one after another. Stacking of mixed crystals of complicated compositions, rather than simple InP or GaAs, in a large number is difficult.

Further, current density is much smaller in a light receiving device, than in a light emitting device. Therefore, degradation of crystal characteristic caused by a large current starting from a dislocation is unlikely. In view of the foregoing, in a light receiving device, it may not be an absolute condition that thickness t of each layer must be at most the critical thickness hc (0<t<hc) according to Matthews/Blakeslee.

The inventor considers the thickness equal to or larger than hc is rather preferable.

Figure 8:
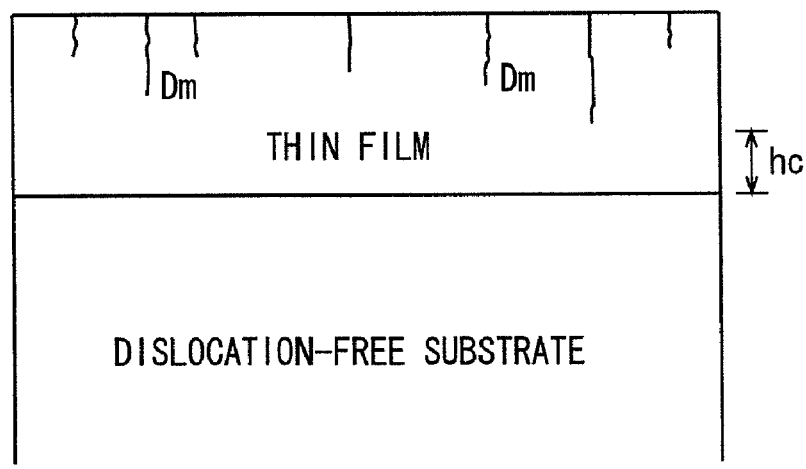
FIG. 8 is a cross-section of a thin film/substrate illustrating Matthews/Blakeslee approach in which a layer of thin film is formed on a dislocation-free substrate.

Referring to FIG. 8, the equation of Matthews/Blakeslee assumes a GaAsP epitaxial layer grown on a GaAs substrate of infinite thickness. At the border, stress generates because of lattice mismatch, which stress gradually increases and, at a certain thickness hc, dislocation occurs, since occurrence of misfit dislocation decreases free energy.

The situation, however, is different from when a number of epitaxially grown layers are stacked. Conventionally, even when a plurality of layers are epitaxially grown, the equation of Matthews/Blakeslee has been used focusing solely on the matching with the substrate, blindly believing that the film thickness must not exceed the value as determined by the equation. Generation and elimination of dislocations are difficult problem and it is always necessary to go back to basics for consideration.

Actually, what is positioned on the substrate is only the first layer, and when hundreds of layers are stacked, all the layers from the second layer and above do not satisfy the prerequisite of Matthews/Blakeslee. This means that situation of thin film/thin film is different from that of thin film/substrate. The inventor believes that different conditions suitable for such situation must be studied. Then, what should be done?

Matthews/Blakeslee is on the premise that a thin film is grown on a dislocation-free substrate, and misfit (mismatch) dislocation generates in the middle (hc) of the thin film. In the present invention, what is on the dislocation-free substrate is only one thin film, and remaining tens and hundreds of thin films are on thin films having dislocations. In this point, it is clearly different.

In the present invention, larger layers (having lattice constant larger than that of InP substrate) and smaller layers (having lattice constant smaller than that of InP substrate) are stacked alternately. Therefore, lattice mismatch f increases to be larger than that with the substrate. Assuming that positive and negative lattice mismatches have approximately the same absolute value, lattice mismatch between each of the thin films would be about twice the lattice mismatch with the substrate. The equation defining the critical thickness involves f in the denominator. Therefore, critical thickness hc for a junction between thin films would be about one half the thickness considered for lattice mismatch with the substrate.

Figure 9:
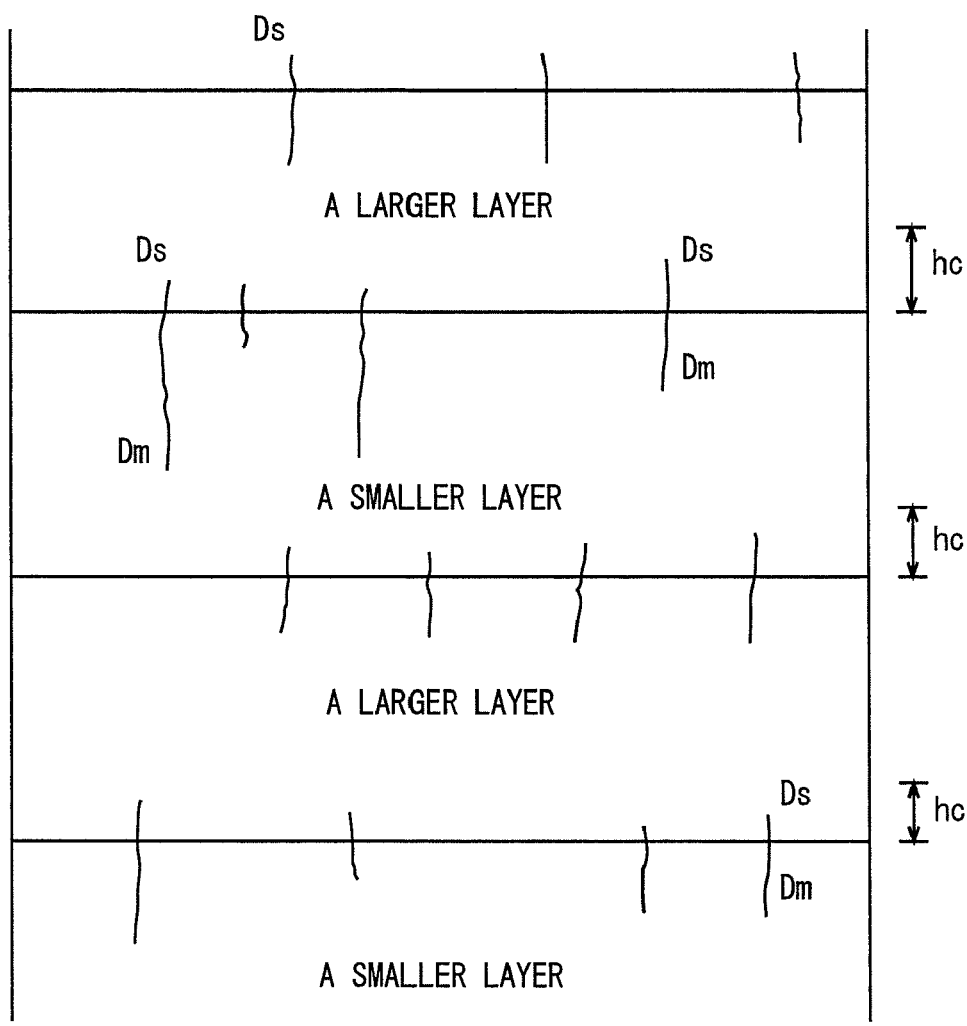
FIG. 9 is a cross-section of thin film/thin film showing inheritance and generation of dislocations in accordance with the present invention, in which thin film/thin film is repeatedly grown.

From the foregoing, it follows that the value of critical thickness hc calculated in consideration of lattice mismatch with the substrate does not reflect the actual situation. When considered carefully, it can be seen that the thin film immediately below has dislocations. The thin film thereon inherits the dislocations. The stress, however, is in the opposite direction and, therefore, the propagated dislocations would eventually be eliminated. How long does it take before elimination? They disappear when the thickness of the film exceeded the critical thickness hc. When the thickness exceeds the critical thickness hc, propagated dislocations Ds are almost entirely eliminated, and dislocations having Burgers vector in the opposite direction are newly generated. These are the misfit (mismatch) dislocations Dm. Misfit (mismatch) dislocations Dm tend not to generate until propagated dislocations Ds disappear and, therefore, generation of misfit dislocations Dm delays. The misfit (mismatch) dislocations Dm will be propagated dislocations Ds when the next film is formed, and extend to an upper layer. The propagated dislocations Ds delay generation of mismatch dislocations Dm in the upper layer. These dislocations, however, disappear by the time the thickness exceeds critical thickness hc. FIG. 9 shows the manner.

Growth is not from a dislocation-free substrate but from a thin film with dislocations. Therefore, the film inherently has propagated dislocations, which delay generation of mismatch dislocations Dm. Mismatch dislocations Dm generated in one layer become propagated dislocations in the next layer and disappear eventually. In this manner, two different types of dislocations generate and disappear alternately. For the dislocations to disappear, thickness t larger than the critical thickness hc is necessary. Therefore, the thickness t should desirably exceed the critical thickness hc.

Further, it is desirable that mismatch dislocations generate and grow in well balanced state between the larger layers and the smaller layers. When the degree of mismatch is large, generation of mismatch dislocations increases. Chance of generation increases if the film thickness increases. The number of mismatch dislocation is in proportion to the product of mismatch and film thickness. In order to realize balanced mismatch dislocations in two types of layers, it is desired that the product of mismatch and film thickness is equal. In the present invention, average n mismatch is set to be at most ±0.2%, in order to attain balanced generation of dislocations and to reduce average dislocation density in two different types of layers.

Because the film is thick, mismatch dislocations generate, which increase but disappear in the next layer. Therefore, extension of dislocations is limited. As a result, dislocation density as a whole becomes smaller.

In addition, the device is not a light emitting device but a light receiving device, in which the current density is small and dislocations, if any, do not multiply. Therefore, degradation starting from dislocations is unlikely.

What poses a problem in a light receiving layer is dark current. The dark current refers to a phenomenon that even in the absence of any light, a current flows in a direction opposite to the reverse-biased pn junction. This relates to the quality of pn junction. The pn junction is formed in an upper mixed crystal light receiving layer. The magnitude of dark current mainly depends on the crystal characteristic of the upper mixed crystal light receiving layer. It does not much depend on the crystal characteristic of the lower light receiving layer. As described above, thick films (hc ~11hc) are stacked alternately, and therefore, crystal characteristics are improved. Upper layers have smaller dislocations. Therefore, pn junction comes to have sufficient reverse voltage. When an InP window layer is additionally provided on the light receiving layer, surface recombination can be prevented and, hence, dark current can be reduced.

If there remains any concern, an InGaAs of well-known characteristic (preferably, an InGaAs layer of which lattice mismatch with the InP substrate is −0.2% to 0.2%) may be placed on the uppermost layer to form a pn junction here. InGaAs does not contain nitrogen (N), antimony (Sb) or phosphorus (P) and good crystal can be formed. When a pn junction is formed in InGaAs, dark current can be lowered.

Though the equation of Matthews/Blakeslee is used for measurement and evaluation of film thickness in the present invention, it is not used directly. The values λ and α are determined uniquely dislocation by dislocation, complicating calculation. Therefore, we assume $\cos \lambda = 0.5$ and $\cos \alpha = 0.5$. It is not necessarily the case that only the dislocations of 60° are considered. Rather, it is to use the equation of Matthews/Blakeslee as a measurable, clear index.

The equation of Matthews/Blakeslee is easy to use and be a good index, as it does not involve modulus of rigidity G. For easier application, the values λ and α are set to $\cos \lambda = 0.5$ and $\cos \alpha = 0.5$. While Non-Patent Document 2 of Matthews/Blakeslee and Non-Patent Document 3 of Jesser/Matthews advocates (0<t<hc), the present invention suggests the film thickness of hc<t<11hc.

If individual material attains lattice matching with InP, f would be f=0 and critical thickness becomes infinite. Such a situation must be avoided. Mismatch between individual film and InP is set to be ±0.5 to ±5% (that is, −5% to −0.5% or at least 0.5% and at most 5%, or absolute value of mismatch is at least 0.5% and at most 5%).

Example 1

Example 1 (GaInNAs/InGaAs); (FIG. 1)

Figure 1:
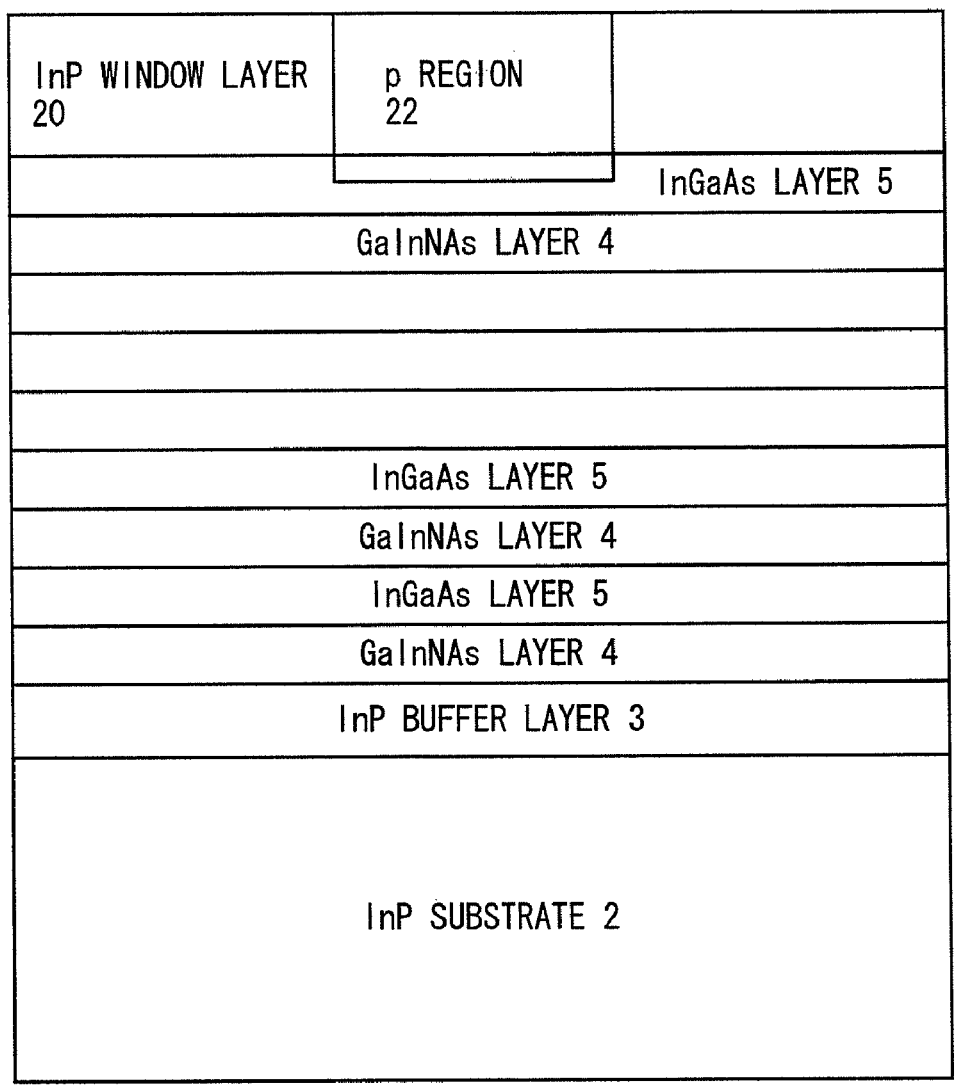
FIG. 1 is a cross-sectional view in accordance with a first embodiment of the present invention, in which GaInNAs layers and InGaAs layers are stacked alternately a plurality of times on an InP buffer layer grown on an InP substrate, an InP window layer is grown thereon and a p region is formed at an upper central portion.

A photodiode having such a structure as shown in FIG. 1 was fabricated. On an InP substrate 2, an InP buffer layer 3 was formed, GaInNAs first light receiving layers 4 and InGaAs second light receiving layer 5 were alternately stacked 40 times (80 layers), an InP window layer 20 was formed at the uppermost portion, and a p region 22 was provided extended from the central portion of InP window layer to reach the uppermost second light receiving layer InGaAs. Though an n electrode is formed in InP substrate 2 and a p electrode is formed in p region 22, the n electrode and p electrode are not shown for simplicity.

Lattice constant of InP is $a_0 = 0.58687$ nm. Lattice mismatch f is calculated as $(a_l - a_0)/a_0$, which is represented by %. To a material having positive value f, a suffix "l" is appended. To a material having negative value f, a suffix "s" is appended.

Though $f=(a_f-a_0)/a_0$, the value itself is not a percentage %. Here, suffix "s" is added if $f<0$ and "l" is added if $f>0$.

In the following equation, Poisson ratio ν and lattice constant a are necessary as material constants in each mixed crystal. It is difficult and at present impractical to actually form such a mixed crystal as a bulk single crystal. The values ν and a cannot be actually measured if a single crystal cannot be formed. Therefore, the values ν and a are calculated using lattice constants and Poisson ratios of known single crystals such as GaAs, GaN, InAs and InP, considering mixed crystal ratio. The value a reflects size of individual component atom and, therefore, proportional calculation is relatively accurate. Poisson ratio inherently has small fluctuation, with the central value being 0.3.

The values ν and a calculated in this manner may not necessarily be the same as the values ν and a of actual mixed crystal. Such difference does not pose a problem. As already described, in the present invention, the equation of Matthews/Blakeslee is used as an equation for measurement and evaluation, and it is not used directly in the original meaning.

Figure 7:
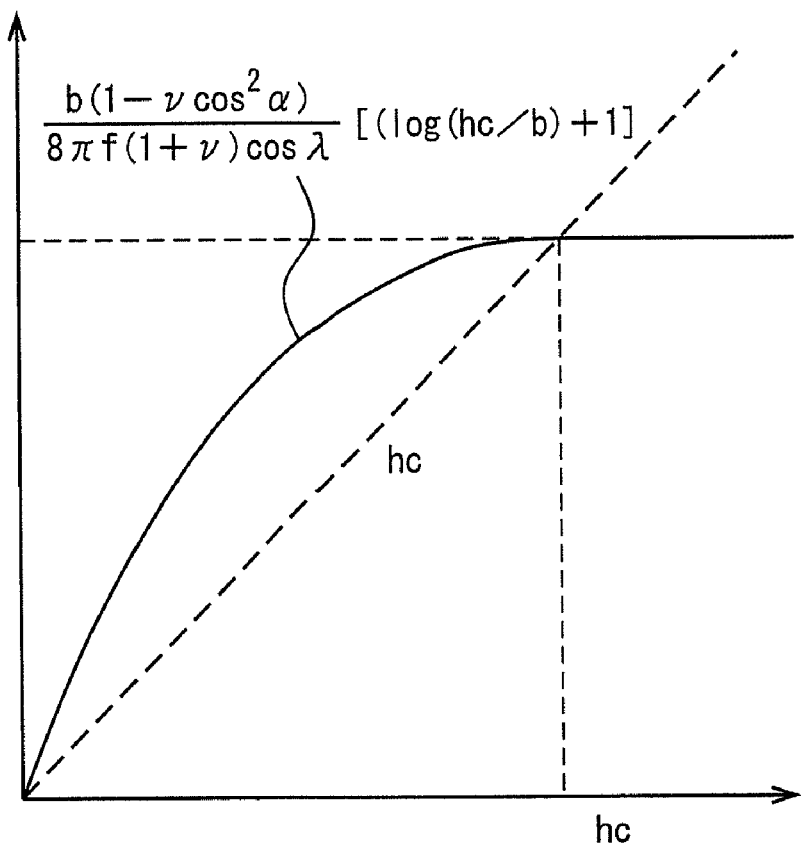
FIG. 7 is a graph plotting the right side $b(1-\nu \cos^2\alpha)\{\log(hc/b)+1\}/8\pi f(1+\nu)\cos\lambda$ and the left side hc independently as functions of hc, showing a method of finding critical thickness hc from the intersection.

(1) First light receiving layer of Example 1 (u=0.20, x=0.04, y=0, z=0)
Mixed crystal composition $Ga_{0.20}In_{0.80}N_{0.04}As_{0.96}$
Lattice constant $a_l$=0.59334 nm
Lattice mismatch=+1.1025%
Film thickness $t_l$=70 nm (critical thickness 9.1 nm)
Number of stacking $n_l$=40
Total film thickness of first light receiving layer $n_l t_l$=2800 nm Critical thickness hc was calculated in the following manner. Parameters ν=0.26005, cos α=0.5, cos λ=0.5, b= $a/2^{1/2}$=0.4195 nm and f=0.011025 were input to the equation above, to find an intersection between the logarithmic graph and a line such as shown in FIG. 7, and the value hc=9.1 nm was found. The thickness of the layer was set to 70 nm, that is, about 7.7 times hc.

(2) Second light receiving layer of Example 1 (u=0.65, x=0, y=0, z=0)
Mixed crystal composition $In_{0.35}Ga_{0.65}As$
Lattice constant $a_s$=0.57952 nm
Lattice mismatch=−1.2524%
Film thickness $t_s$=70 nm (critical thickness 7.4 nm)
Number of stacking $n_s$=40
Total film thickness of second light receiving layer $n_s t_s$=2800 nm
Total thickness of light receiving layers $n_l t_l + n_s t_s$=5600 nm
Average lattice mismatch=−0.0735%

Critical thickness hc was calculated in the following manner. Parameters ν=0.28615, cos α=0.5, cos λ=0.5, b= $a/2^{1/2}$=0.4098 nm and f=−0.012524 were input to the equation above, to find an intersection between the logarithmic graph and a line such as shown in FIG. 7, and the value hc=7.4 rum was found. The thickness of the layer was set to 70 nm, that is, about 9.4 times hc.

Average lattice mismatch is {+1.1025×2800+(−1.2524)× 2800}/5600=−0.0735%.

In Example 1, though the second light receiving layer does not have sensitivity to infrared of 2.0 μm to 3.0 μm, it has sensitivity up to 1.6 μm and, therefore, it serves as a light receiving layer.

Example 2

Example 2 (GaInNAsSb/GaAsSb); (FIG. 2)

Figure 2:
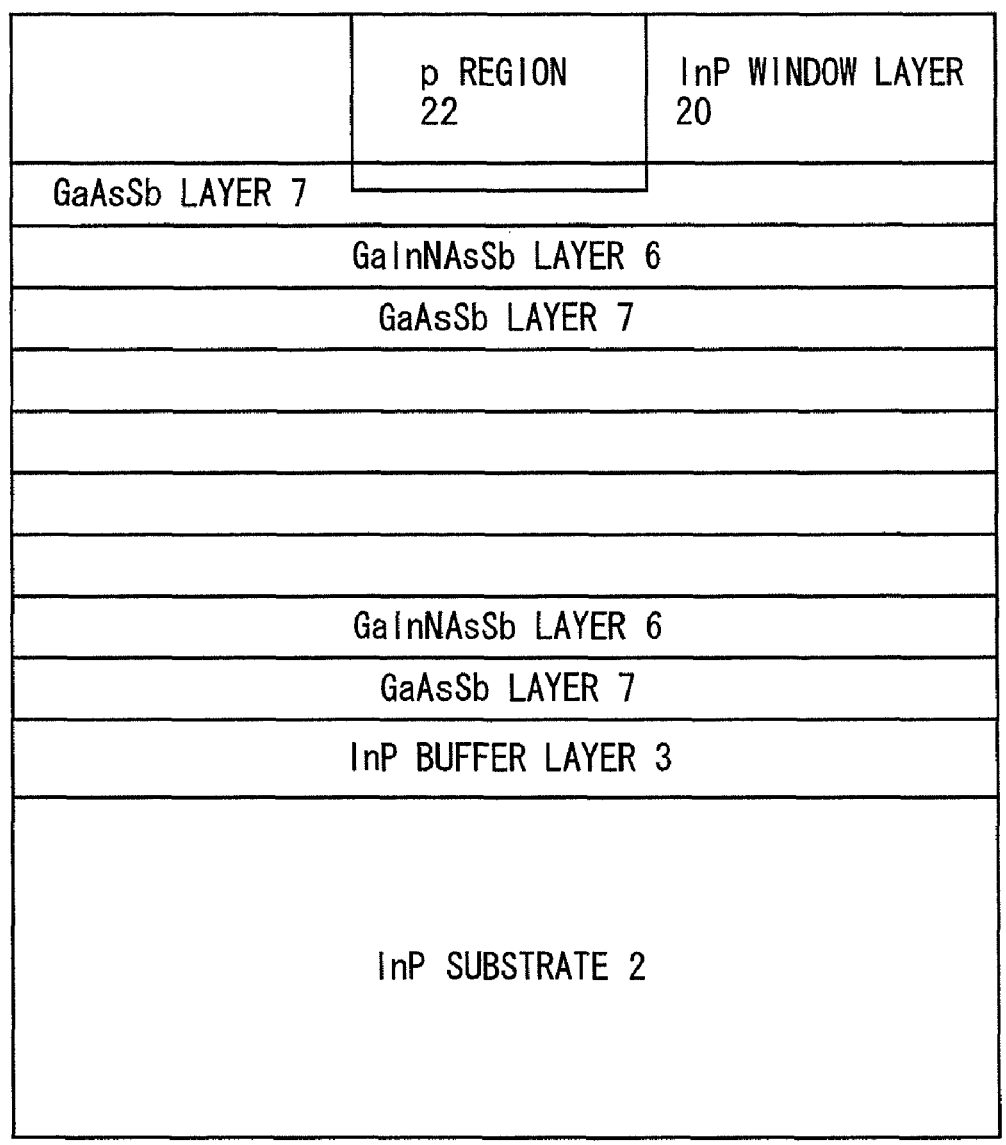
FIG. 2 is a cross-sectional view in accordance with a second embodiment of the present invention, in which GaInNAsSb layers and GaAsSb layers are stacked alternately a plurality of times on an InP buffer layer grown on an InP substrate, an InP window layer is grown thereon and a p region is formed at an upper central portion.

A photodiode having such a structure as shown in FIG. 2 was fabricated. On an InP substrate 2, an InP buffer layer 3 was formed, GaInNAsSb first light receiving layer 6 and GaAsSb second light receiving layer 7 were alternately stacked 30 times and 31 times respectively (a total of 61 layers), an InP window layer 20 was formed at the uppermost portion, and a p region 22 was provided extended from the central portion of InP window layer to reach the uppermost second light receiving layer GaAsSb. Though an n electrode is formed in InP substrate 2 and a p electrode is formed in p region 22, the n electrode and p electrode are not shown for simplicity.

(1) First light receiving layer of Example 2 (u=0.25, x=0.04, y=0.05, z=0)
Mixed crystal composition $Ga_{0.25}In_{0.75}N_{0.04}Sb_{0.05}As_{0.91}$
Lattice constant $a_l$=0.59343 nm
Lattice mismatch=+1.1178%
Film thickness $t_l$=80 nm (critical thickness 9.1 nm)
Number of stacking $n_l$=30
Total film thickness of first light receiving layer $t_l n_l$=2400 nm Critical thickness hc was calculated in the following manner. Parameters ν=0.26005, cos α=0.5, cos λ=0.5, b= $a/2^{1/2}$=0.4196 nm and f=0.011178 were input to the equation above, to find an intersection between the logarithmic graph and a line such as shown in FIG. 7, and the value hc=9.1 nm was found. The thickness of the layer was set to 80 nm, that is, about 8.8 times hc.

(2) Second light receiving layer of Example 2 (u=1, x=0, y=0.35, z=0)
Mixed crystal composition $GaAs_{0.65}Sb_{0.35}$
Lattice constant $a_s$=0.58081 nm
Lattice mismatch=−1.0326%
Film thickness $t_s$=75 nm (critical thickness 9.2 nm)
Number of stacking $a_s$=31
Total film thickness of second light receiving layer $n_s t_s$=2325 nm
Total thickness of light receiving layers $n_l t_l + n_s t_s$=4725 nm
Average lattice mismatch=−0.0597%
Critical thickness hc was calculated in the following manner. Parameters ν=0.311, cos α=0.5, cos λ=0.5, b= $a/2^{1/2}$=2=0.4107 nm and f=−0.010326 were input to the equation above, to find an intersection between the logarithmic graph and a line such as shown in FIG. 7, and the value hc=9.2 nm was found. The thickness of the layer was set to 75 nm, that is, about 8.2 times hc.

Average lattice mismatch is {+1.1178×2400+(−1.0326)× 2325}/4725=+0.0597%.

Example 3

Example 3 (GaInNAsSbP/GaInNAs); (FIG. 3)

Figure 3:
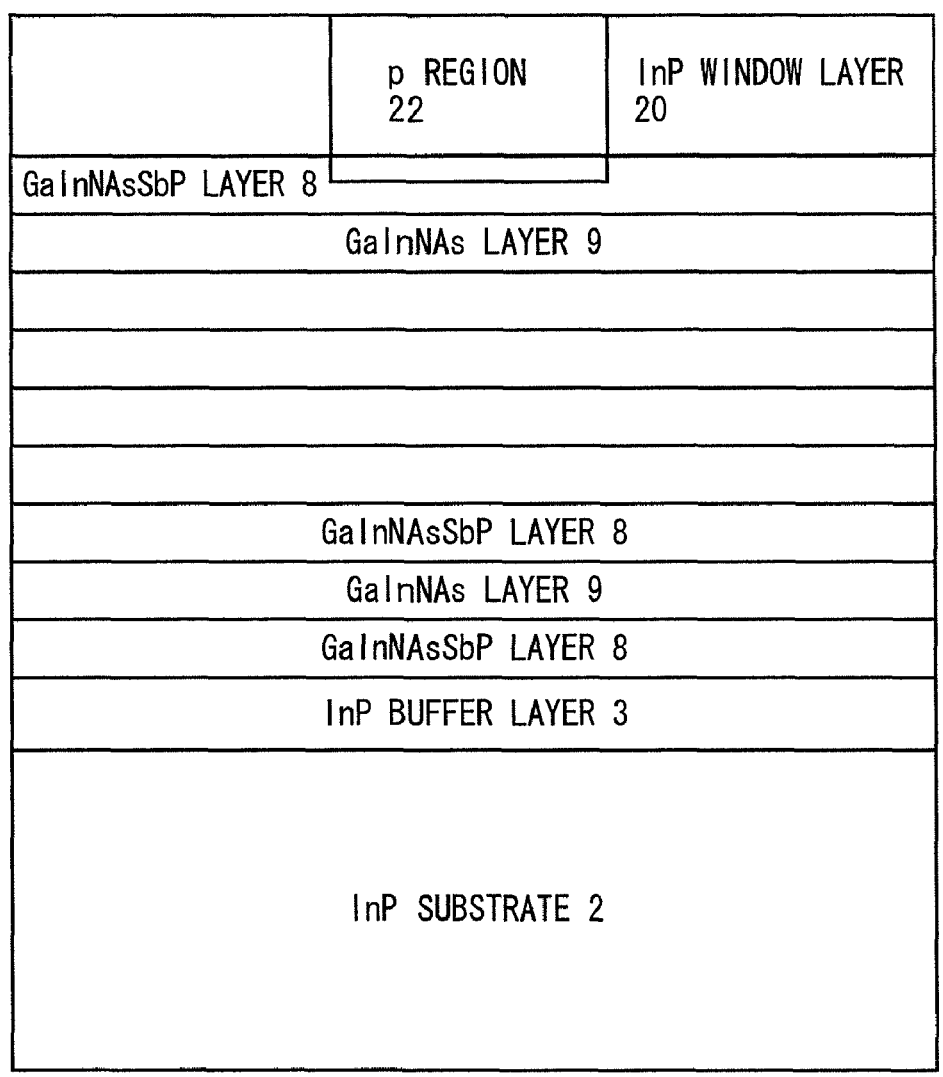
FIG. 3 is a cross-sectional view in accordance with a third embodiment of the present invention, in which GaInNAsSbP layers and GaInNAs layers are stacked alternately a plurality of times on an InP buffer layer grown on an InP substrate, an InP window layer is grown thereon and a p region is formed at an upper central portion.

A photodiode having such a structure as shown in FIG. 3 was fabricated. On an InP substrate 2, an InP buffer layer 3 was formed, GaInNAsSbP first light receiving layer 8 and GaInNAs second light receiving layer 9 were alternately stacked 26 times and 25 times respectively (a total of 51 layers), an InP window layer 20 was formed at the uppermost portion, and a p region 22 was provided extended from the central portion of InP window layer to reach the uppermost first light receiving layer GaInNAsSbP. Though an n electrode is formed in InP substrate 2 and a p electrode is formed in p region 22, the n electrode and p electrode are not shown for simplicity.

(1) First light receiving layer of Example 3 (u=0.25, x=0.04, y=0.05, z=0.01)
Mixed crystal composition $Ga_{0.25}In_{0.75}N_{0.04}Sb_{0.5}P_{0.01}As_{0.90}$
Lattice constant $a_l$=0.593475 nm
Lattice mismatch=+1.1255%
Film thickness $t_l$=90 nm (critical thickness 8.8 nm)
Number of stacking $n_l$=26

Total film thickness of first light receiving layer $n_l t_l$=2340 nm

Critical thickness hc was calculated in the following manner. Parameters $\nu$=0.26818, cos $\alpha$=0.5, cos $\lambda$=0.5, b=$a/2^{1/2}$=0.4197 nm and f=0.011255 were input to the equation above, to find an intersection between the logarithmic graph and a line such as shown in FIG. 7, and the value hc=8.8 nm was found. The thickness of the layer was set to 90 nm, that is, about 10.3 times hc.

(2) Second light receiving layer of Example 3 (u=0.51, x=0.04, y=0, z=0)
Mixed crystal composition $Ga_{0.51}In_{0.49}N_{0.04}As_{0.96}$
Lattice constant $a_s$=0.58071 nm
Lattice mismatch=−1.0496%
Film thickness $t_s$=100 nm (critical thickness 9.5 nm)
Number of stacking $n_s$=25
Total film thickness of second light receiving layer $n_s t_s$=2500 nm
Total thickness of light receiving layers $n_l t_l + n_s t_s$=4840 nm
Average lattice mismatch=0.0274%

Critical thickness hc was calculated in the following manner. Parameters $\nu$=0.26818, cos $\alpha$=0.5, cos $\lambda$=0.5, b=$a/2^{1/2}$=0.4106 nm and f=−0.010496 were input to the equation above, to find an intersection between the logarithmic graph and a line such as shown in FIG. 7, and the value hc=9.5 nm was found. The thickness of the layer was set to 100 nm, that is, about 110.5 times hc.

Average lattice mismatch is {+1.1255×2340+(−1.0496)×2500}/4840=+0.0018%.

Example 4

Figure 4:
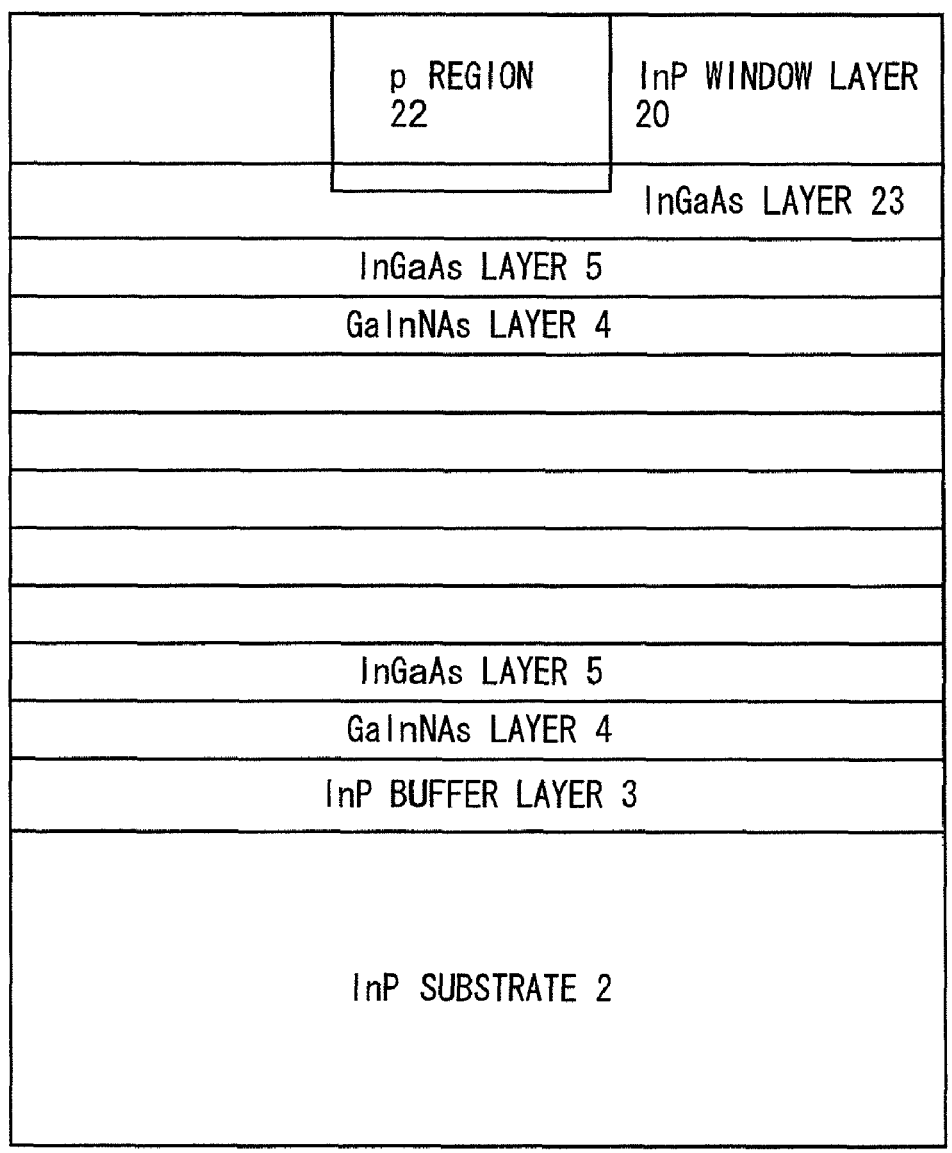
FIG. 4 is a cross-sectional view in accordance with a fourth embodiment of the present invention, in which GaInNAs layers and InGaAs layers are stacked alternately a plurality of times on an InP buffer layer grown on an InP substrate, an InGaAs layer and an InP window layer are grown thereon in this order and a p region is formed at an upper central portion such that a pn junction is positioned in the InGaAs layer.

Example 4 (GaInNAs/InGaAs+InGaAs); (FIG. 4)

This corresponds to the alternately stacked multilayered structure of GaInNAs/InGaAs according to Example 1, with an InGaAs layer 23 additionally provided between the uppermost one of the alternating layers and the InP window layer 20. InGaAs layer 23 has such a composition that attains matching with the InP substrate. Pn junction is positioned in the InGaAs layer 23. Because of the InGaAs layer 23, dark current can further be reduced.

Example 5

Figure 5:
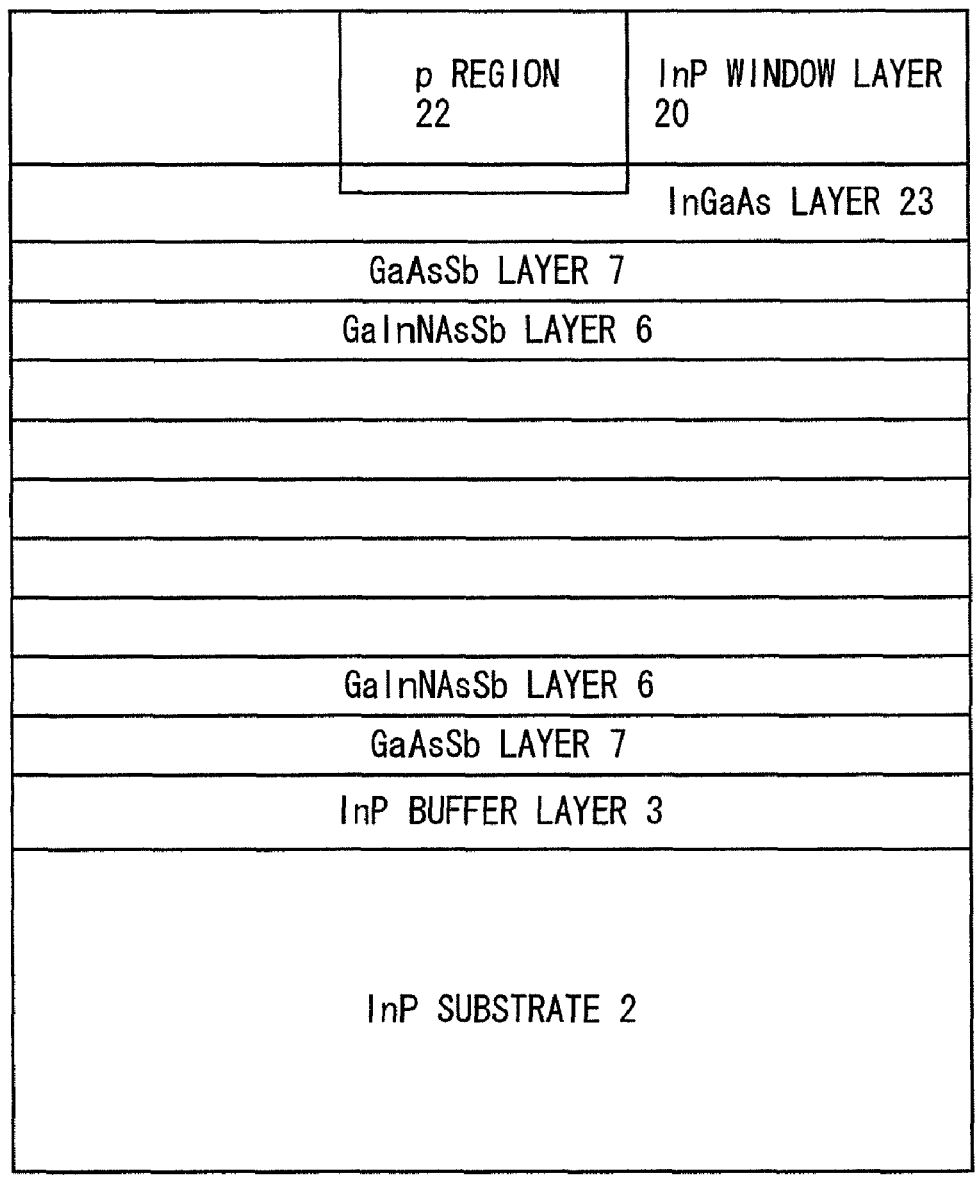
FIG. 5 is a cross-sectional view in accordance with a fifth embodiment of the present invention, in which GaInNAsSb layers and GaAsSb layers are stacked alternately a plurality of times on an InP buffer layer grown on an InP substrate, an InGaAs layer and an InP window layer are grown thereon in this order and a p region is formed at an upper central portion such that a pn junction is positioned in the InGaAs layer.

Example 5 (GaInNAsSb/GaAsSb+InGaAs); (FIG. 5)

This corresponds to the alternately stacked multilayered structure of GaInNAsSb/GaAsSb according to Example 2, with an InGaAs layer 23 additionally provided between the uppermost one of the alternating layers and the InP window layer 20. InGaAs layer 23 has such a composition that attains matching with the InP substrate. Pn junction is positioned in the InGaAs layer 23. Because of the InGaAs layer 23, dark current can further be reduced.

Example 6

Figure 6:
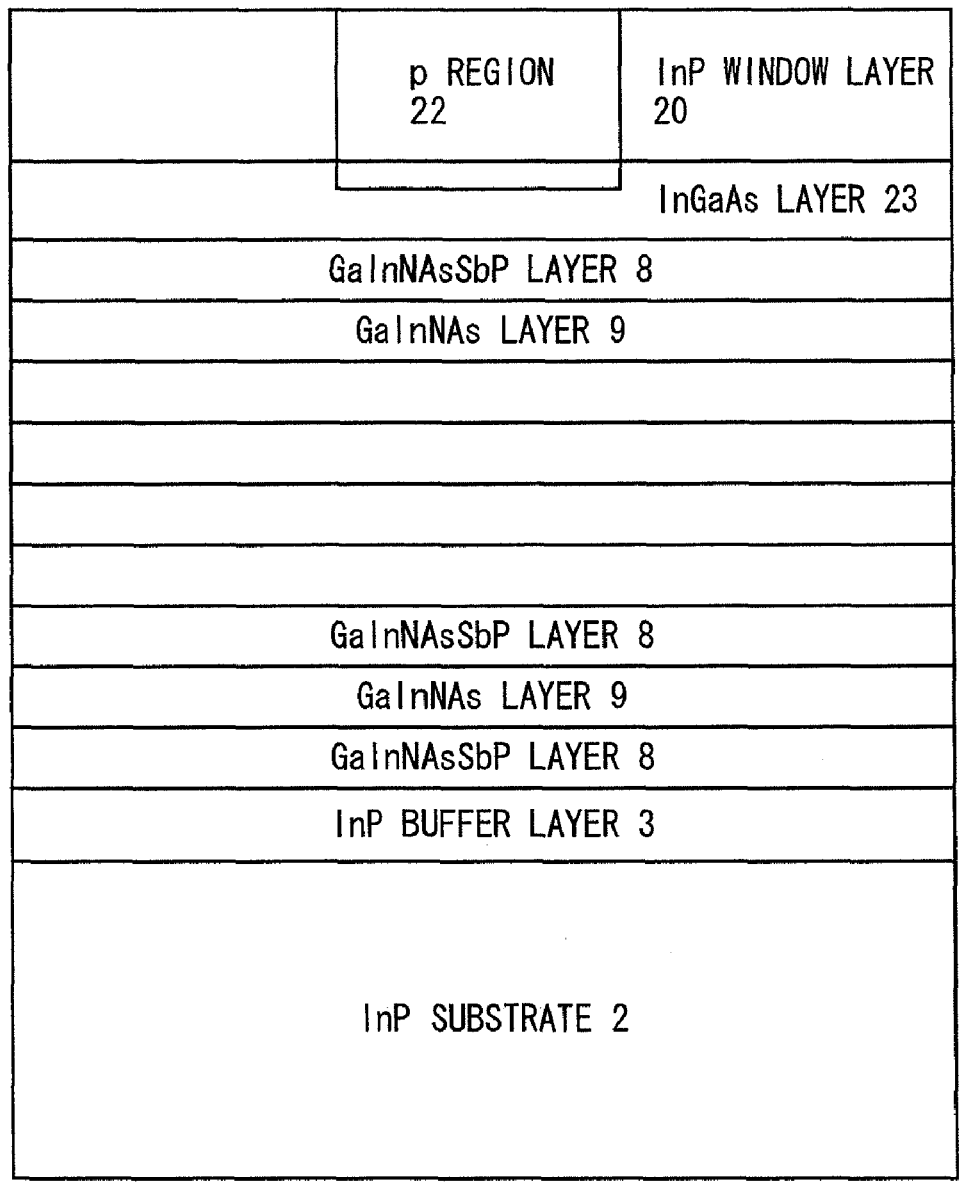
FIG. 6 is a cross-sectional view in accordance with a sixth embodiment of the present invention, in which GaInNAsSbP layers and GaInNAs layers are stacked alternately a plurality of times on an InP buffer layer grown on an InP substrate, an InGaAs layer and an InP window layer are grown thereon in this order and a p region is formed at an upper central portion such that a pn junction is positioned in the InGaAs layer.

Example 6 (GaInNAsSbP/GaInNAs+InGaAs); (FIG. 6)

This corresponds to the alternately stacked multilayered structure of GaInNAsSbP/GaInNAs according to Example 3, with an InGaAs layer 23 additionally provided between the uppermost one of the alternating layers and the InP window layer 20. InGaAs layer 23 has such a composition that attains matching with the InP substrate. Pn junction is positioned in the InGaAs layer 23. Because of the InGaAs layer 23, dark current can further be reduced.

The invention claimed is:

1. A light receiving device, comprising:
an InP substrate; and
a light receiving layer formed by alternately stacking a larger layer formed of GaInNAsSbP mixed crystal having nitrogen content of at most 5% in 5 group, larger lattice constant (a) than that of the InP substrate ($a_0$) and thickness between hc and 11hc, the critical thickness hc being determined as hc=b(1−$\nu$ $\cos^2\alpha$){log(hc/b)+1}/8$\pi$f(1+$\nu$)cos $\lambda$ (log being natural logarithm, b=$a/2^{1/2}$, $\nu$ representing Poisson ratio, f representing lattice mismatch (a−$a_0$)/$a_0$ with InP, cos $\lambda$=0.5, cos $\alpha$=0.5) and a smaller layer formed of GaInNAsSbP mixed crystal having nitrogen content of at most 5% in 5 group, smaller lattice constant (a) than that of the InP substrate ($a_0$) and thickness between hc and 11hc; wherein
absolute value of lattice mismatch of the larger layer and the smaller layer to the InP substrate is at least 0.5% and at most 5% respectively;
at least one of the larger layer and the smaller layer has absorption edge wavelength of 2.0 μm to 3.0 μm;
total thickness of the smaller layers and total thickness of the larger layers are each 2.0 μm to 4.0 μm; and
average lattice mismatch obtained by multiplying lattice mismatch by thickness and averaging is at most ±0.2%.

2. The light receiving device according to claim 1, wherein the larger layer is any of GaInNAs, GaInNAsSb, GaInNAsP and GaInNAsSbP, and has absorption edge wavelength of 2.0 μm to 3.0 μm.

3. The light receiving device according to claim 2, wherein an InP window layer is provided on the light receiving layer.

4. The light receiving device according to claim 3, wherein an InGaAs layer having lattice mismatch with the InP substrate of at most ±0.2% is provided on the light receiving layer; and
a pn junction is formed in the InGaAs layer.

5. The light receiving device according to claim 2, wherein an InGaAs layer having lattice mismatch with the InP substrate of at most ±0.2% is provided on the light receiving layer; and
a pn junction is formed in the InGaAs layer.

6. The light receiving device according to claim 1, wherein an InP window layer is provided on the light receiving layer.

7. The light receiving device according to claim 6, wherein an InGaAs layer having lattice mismatch with the InP substrate of at most ±0.2% is provided on the light receiving layer; and
a pn junction is formed in the InGaAs layer.

8. The light receiving device according to claim 1, wherein an InGaAs layer having lattice mismatch with the InP substrate of at most ±0.2% is provided on the light receiving layer; and
a pn junction is formed in the InGaAs layer.

* * * * *